United States Patent [19]
Yuan et al.

[11] 3,932,815
[45] Jan. 13, 1976

[54] BROADBAND WAVEGUIDE MIXER

[75] Inventors: Lloyd T. Yuan, Hacienda Heights; Jack S. Honda, Palos Verdes, both of Calif.

[73] Assignee: TRW Inc., Redondo Beach, Calif.

[22] Filed: Mar. 21, 1975

[21] Appl. No.: 560,917

[52] U.S. Cl. ............................. 325/445; 321/69 W
[51] Int. Cl.² ........................................ H04B 1/26
[58] Field of Search ........... 325/445, 446, 442, 450, 325/449, 451; 321/69 W, 69 R, 69 NL, 60; 333/10, 11, 24.1, 37; 329/160, 161

[56] References Cited
UNITED STATES PATENTS

| | | | |
|---|---|---|---|
| 3,512,090 | 5/1970 | Mouw | 325/442 |
| 3,532,989 | 10/1970 | Saad | 325/445 |
| 3,553,584 | 1/1971 | Walsh | 325/9 |
| 3,584,306 | 6/1971 | Spacek | 325/446 |
| 3,638,126 | 1/1972 | Spacek | 325/446 |
| 3,665,508 | 5/1972 | Gawler | 325/446 |
| 3,706,042 | 12/1972 | Tenenholtz | 325/446 |

OTHER PUBLICATIONS
IEEE Transactions, Vol. MTT-16, No. 11; Nov. 1968, pp. 911–918.

IEEE-GMTT Microwave Symposium, May 19, 1971, pp. 188–190.

*Primary Examiner*—George H. Libman
*Assistant Examiner*—Robert Hearn
*Attorney, Agent, or Firm*—Daniel T. Anderson, Esq.; Edwin A. Oser, Esq.; Jerry A. Dinardo

[57] ABSTRACT

A broadband waveguide mixer suitable for the microwave and millimeter wave regions is described. The mixer is characterized by having a unique dual-guide mixer mount through which extends two parallel and spaced waveguides. The RF wave and the local oscillator wave are respectively impressed on the two waveguides via a hybrid coupler. A pair of crossbars extend through each waveguide. A pair of diodes connected back-to-back are disposed in each waveguide and are connected to the respective crossbars. Each pair of diodes has a polarity opposite to that of the other pair. The output is derived from a coaxial cable connected to the adjacent ends of the two crossbars. The input signals may be applied by a folded hybrid tee or a short slot hybrid coupler to simplify the input structure. The mixer has low noise and broadband performance.

11 Claims, 3 Drawing Figures

BROADBAND WAVEGUIDE MIXER

BACKGROUND OF THE INVENTION

This invention relates generally to broadband waveguide mixers and particularly to a mixer suitable for use in the microwave and millimeter wave regions.

Various mixers have been proposed in the past for high frequency operation such as the microwave and millimeter regions. Thus in the paper to Dickens et al. which appears in the IEEE-GMTT Microwave Symposium on page 188–190 May 19, 1971, there is disclosed a mixer which operates in the microwave region which extends roughly from 1 - 300 gigahertz (GHz). The mixer is provided with back-to-back diodes mounted on a crossbar, that is on an element extending longitudinally through the structure. However the two diodes are connected in a back-to-back configuration operating as a single-ended mixer.

On the other hand, the paper to Mouw which appears in IEEE Transactions, Volume MTT-16, No. 11 November 1968, pages 911 - 918 discloses a star modulator and particularly FIG. 8a shows a doubly balanced, four diode, star mixer or modulator. This structure consists of two pairs of back-to-back diodes, each pair having a polarity opposite to that of the other pair. However, the input connections to this star mixer are rather complicated and the proposed hybrid junction is not easily adapted for millimeter wave operation. The patent to Mouw U.S. Pat. No. 3,512,090 discloses the same type of four star mixer, see for example FIG. 6.

Concerning the patented art, reference is made to the patent to Saad U.S. Pat. No. 3,532,989. The mixer shown in FIG. 2 does not have the convenient crossbar structure and requires three hybrids for its inputs. In addition the structure does not operate in the gigahertz region. A similar mixer is disclosed in the patent to Tenenholtz U.S. Pat. No. 3,706,042.

The patent to Gawler U.S. Pat. No. 3,665,508 discloses a balanced diode mixer which, however, requires more than two input transformers. Also, the structure is not adapted for the microwave region. The patent to Walsh, Jr. U.S. Pat. No. 3,553,584 relates to an up-converter and modulator for relatively low frequency applications. For the up converter of FIG. 6, only one diode is required and the pairs of diodes of FIG. 4 do not have reverse polarity. Finally, the patents to Spacek U.S. Pat. Nos. 3,584,306 and 3,638,126 both relate to high frequency converters having a crossbar but only a single pair of diodes which are connected in series.

SUMMARY OF THE INVENTION

A broadband waveguide mixer in accordance with the invention is suitable for use in the microwave and millimeter wave regions and comprises a unique dual-guide mixer mount. Two waveguides, extending through the waveguide mount are substantially parallel and spaced from each other. Furthermore, two elongated conductive elements or crossbars extend each transversely through the two waveguides. Means may be provided for insulating the crossbars from the waveguide mount. Further, two pairs of diodes are arranged back-to-back. Each pair is disposed in one of the waveguides and is in contact with its associated crossbar. One pair of diodes has a polarity opposite to that of the other pair of diodes. Finally, a coaxial conductor such as a cable is connected to the adjacent elements of the crossbars to derive an output signal corresponding to the difference frequency of the two input waves impressed on the two waveguides.

For the purpose of applying the two input waves to the mixer, there may be provided a folded hybrid tee or a short slot hybrid coupler and an adaptor. The adaptor consists of two outwardly diverging waveguides to match the waveguides of the mixer mount. Such an adaptor is sometimes referred to as a sidewall panty adaptor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing.

DESCRIPTION OF THE PREFERRED EMBODIMENT

Figure 1:
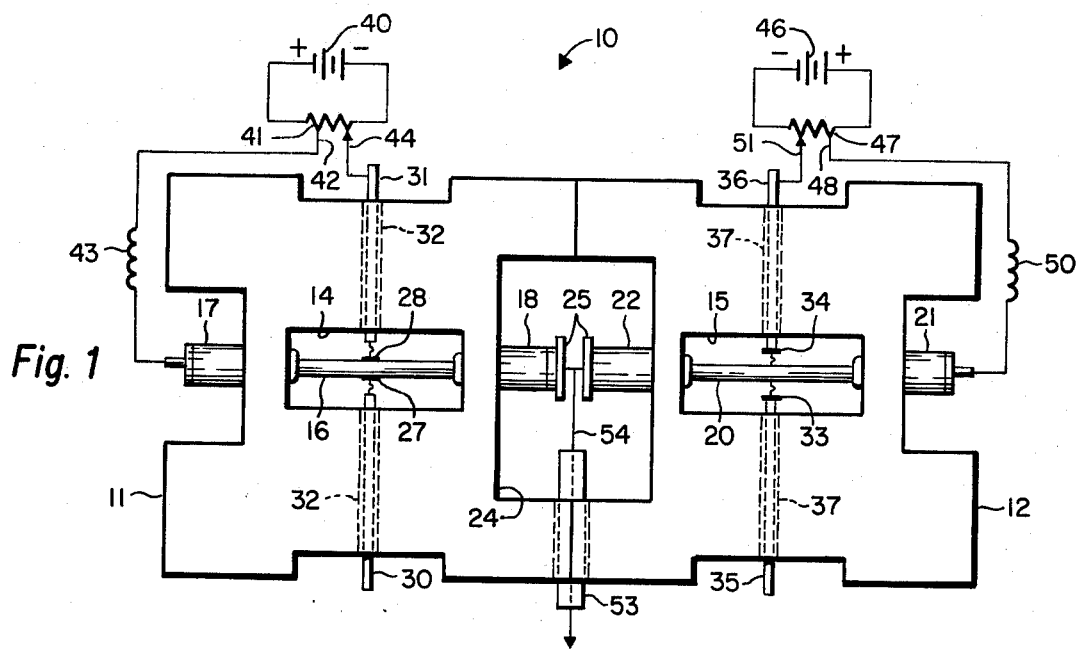
FIG. 1 is a side elevational view of the broadband waveguide mixer of the invention.
Figure 2:
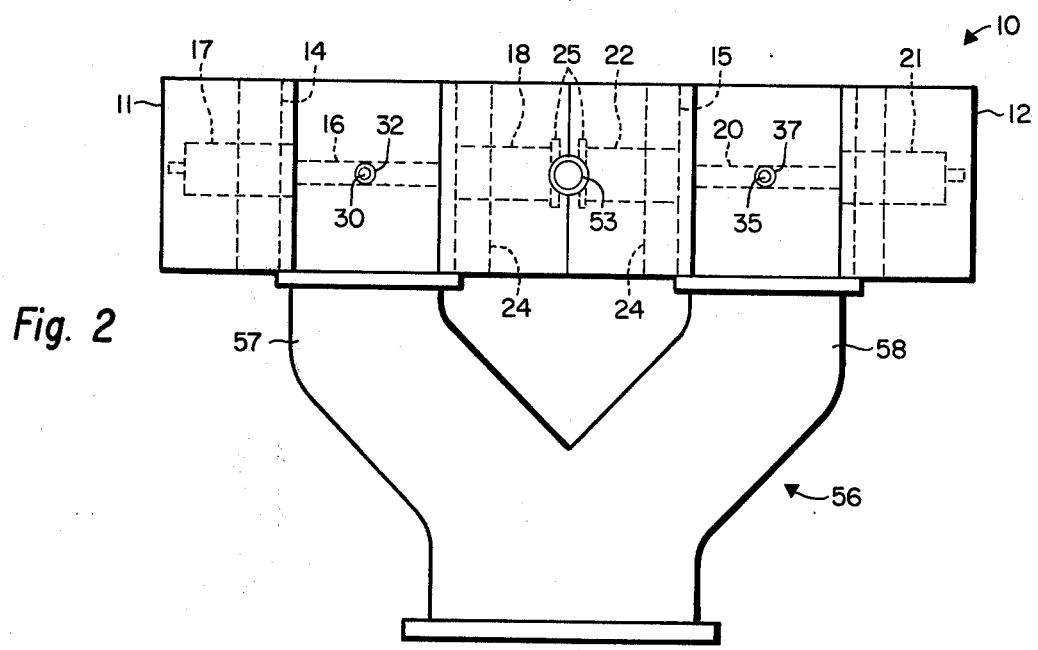
FIG. 2 is a top plan view of the mixer of FIG. 1 taken on line 2 — 2 of FIG. 1.

A preferred embodiment of the broadband waveguide mixer of the invention is illustrated in FIGS. 1 and 2 to which reference is now made. The mixer includes a mixer mount generally indicated at 10 which may consist as shown of two identical mixer portions 11 and 12 or else it might be made in a single unit. The mixer mount 12 may be consist of a suitable conductive material such as metal. Extending through the mount portion 11 is a first waveguide 14. A second waveguide 15 extends through the second mount portion 12 in such a manner that the two waveguides are parallel to each other and are spaced from each other.

A conductive rod or crossbar 16 extends transversely through the waveguide 14 and through the walls of mount portion 11. The crossbar 16 may be electrically insulated from the two walls of the waveguide mount by a ceramic sleeve or pedestal 17 and 18. Similarly a second conductive rod or crossbar 20 extends transversely through the second waveguide 15. It in turn is electrically insulated from the walls of the mount portion 12 by insulating sleeves 21 and 22 which may, for example, also consist of an insulating ceramic material. The two adjacent ends of the crossbars 16 and 20 extend into a common opening 24 provided in the waveguide mount 10. Optionally capacitors 25 may be secured to the adjacent ends of the crossbars 16 and 20 for a purpose to be described hereinafter. However, it is to be understood that the capacitors may be omitted.

Further, in accordance with the present invention, there is provided a first pair of diodes 27 and 28 connected back-to-back and in contact with the crossbar 16. Each diode 27 and 28 may in turn be mounted on a conductive rod 30, 31 extending through suitable apertures in the mount portion 11 and insulated therefrom by an insulating sleeve 32.

Similarly, a second pair of diodes 33 and 34 is connected back-to-back but in a polarity opposite to that of the first pair of diodes 27, 28. Each of the diodes 33 and 34 is in contact with its associated crossbar 20. Further, each of the diodes 33 and 34 is mounted respectively on a conductive rod 35, 36 extending through suitable apertures in the waveguide mount 12. Again each of the rods 35 and 36 is insulated from the waveguide mount by a suitable insulating sleeve 37. Thus, as shown, the cat whiskers of diodes 27 and 28 are connected to their respective rods 30 and 31. On the other hand, the cat whiskers of diodes 33 and 34 are connected to their associated crossbar 20.

Means may be provided for separately biasing each of the two pairs of diodes, that is diodes 27, 28 and diodes 33, 34. To this end there may be provided a battery 40 connected across a resistor 41 having a fixed tap 42 which is connected through a choke 43 to the free end of the crossbar 16 to provide a reference potential. A movable tap 44 on the resistor 41 is connected to the rod 31 of the diode 28. Hence by moving the tap 44 the potential applied between the crossbar 16 and the diode 28 can be varied or adjusted. It will be understood that a similar bias circuit may be applied to the diode 27, but has not been shown for the sake of clarity. The choke 43 serves the purpose to prevent RF and IF signals from leaking out to the bias circuit. The capacitors 25 act as blocking capacitors to prevent the direct currents from reaching the output circuit.

A similar bias circuit is provided for the diode 34 and includes a battery 46 connected across a resistor 47. A fixed tap 48 on the resistor 46 is connected through a choke 50 to the outer end of the crossbar 20. A variable tap 51 is connected to the rod 36 of the diode 34. It will be understood that a similar bias circuit may be provided for the diode 33.

The purpose of the bias circuits is to provide fine tuning of the diodes, that is to bring each diode to its proper operating point. The same purpose could be effected by raising the local oscillator power, but this would be wasteful of the local oscillator energy.

The two pairs of diodes 27, 28 and 33, 34 preferably are Schottky barrier diodes. They may either be silicon or gallium arsenide diodes.

The output signal, that is the mixed or difference signal, is obtained from a coaxial conductor or cable 53 having a center conductor 54 connected to the two capacitors 25 or in the absence thereof to the adjacent ends of the two crossbars 16 and 20.

Two signals to be mixed are applied to the two waveguides 14 and 15. By way of example, the two signals may consist of a radio frequency wave and a local oscillator wave, in which case the output wave is the intermediate frequency or difference wave. The two input waves may be impressed on a folded hybrid tee or a short slot hybrid coupler or any other form of hybrid tee.

Such a hybrid tee will deliver two output waves which are 180° out of phase or in phase, one of which is the radio frequency signal while the other is the local oscillator. The two waves may be impressed on the two waveguides 14 and 15 by an adaptor 56. The adaptor has two outwardly diverging waveguide sections 57 and 58 and is sometimes referred to as a sidewall panty adaptor.

The operation of the waveguide mixer of FIGS. 1 and 2 will now be explained. The two waves are delivered separately to the two waveguides 14 and 15. As previously explained, they may be either in phase or 180° out of phase. Preferably, the waves are in the microwave and millimeter wave region which is approximately from 1 to approximately 300 GHz. Specifically, the mixer of FIGS. 1 and 2 has been operated in the Ka band which is from 26.5 to 40 GHz. The diodes 27, 28 or 33, 34 are now matched to the impedance of the waveguide. Thus, the impedance of the waveguide is on the order of 400 – 500 ohms while that of each diode is about 100 ohms. However, the pair of diodes, say diodes 27, 28 is connected in series with respect to the signal impressed on each of the waveguides and therefore the two serially connected diodes provide an improved impedance match condition to the waveguide impedance.

The output signal is not obtained from the coaxial line 53 which has an impedance of say about 50 ohms. However, looking at each pair of diodes from the output lead 54, they are connected in parallel and therefore again their impedance is matched to that of the output line.

The output signal is obtained through the side wall of each waveguide 14 or 15. At this physical location the radio frequency field is at a minimum which substantially eliminates leakage of either the radio frequency signal or the local oscillator power. This is the reason that it is not necessary to use radio frequency chokes at the output coaxial line 53. Such a choke would tend to increase the noise and detract from the broadband performance.

It should be noted that since the polarity of each pair of diodes is reversed with respect to that of the other pair and because the input signal is 180° out of phase, the difference frequency as seen from the coaxial line 53 is in phase. The chokes 43 and 50 can be so selected as to form an anti-resonant circuit together with the distributed capacitance of the structure.

Figure 3:
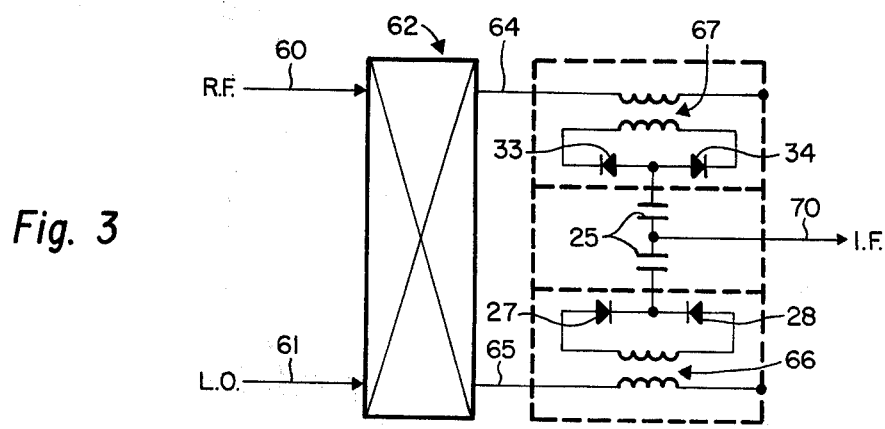
FIG. 3 is an equivalent circuit of the mixer of FIGS. 1 and 2.

Reference may now be made to the equivalent circuit of FIG. 3. Input lead 60 shows how the RF signal is applied while the lead 61 serves to impress the local oscillator wave. The structure 62 generally represents the hybrid coupler. Accordingly, the radio frequency signal is delivered by the lead 64 and the local oscillator wave 65 180° out of phase. The transformer 66 schematically represents how the local oscillator wave is impressed on the two diodes 27, 28. Similarly, the transformer 67 schematically represents how the radio frequency signal is applied to the diodes 33, 34. The capacitors 25 are connected respectively between the junction points of the two pairs of diodes 27, 28 and 33, 34 and the output lead 70 from which the intermediate frequency wave is derived.

The mixer of FIGS. 1 and 2 has been operated in the Ka band, that is from 26.5 – 40 GHz. With a bandwidth of 6 GHz the voltage standing wave ratio of the radio frequency signal is 2 to 1 and the IF center frequency 600 mhz. The i.f. bandwidth is 400 mhz and the double sideband noise figure at 38 GHz is 5.9 db. It should, of course, be noted that the mixer will work equally well in other frequency ranges.

There has thus been disclosed a broadband waveguide mixer which is double balanced and characterized by a double crossbar configuration. Due to the fact that the four mixer diodes are symmetrically disposed in a double waveguide mount, low noise and broadband mixer performance is achieved. The structure permits the use of a folded magic tee or short slot hybrid coupler which much simplifies the input circuitry and the hardware design problem. The output signal is obtained through the common wall of the waveguide mount, thereby obviating the necessity of an output choke with its attendant disadvantages. Finally, the diodes may be individually supplied with suitable bias for fine tuning, thereby to reduce the local oscillator power demands.

What is claimed is:

1. A broadband waveguide mixer suitable for use in the microwave and millimeter wave regions comprising:
   a. a first waveguide;
   b. a second waveguide, said waveguides being disposed substantially parallel and spaced from each other;
   c. a first elongated conductive element extending transversely through said first waveguide;
   d. a second elongated conductive element extending transversely through said second waveguide, said elements being disposed substantially on a common axis and being spaced from each other;
   e. a first pair of diodes arranged back-to-back and disposed in said first waveguide and in contact with said first element;
   f. a second pair of diodes arranged back-to-back and disposed in said second waveguide and in contact with said second element, said first pair of diodes having a polarity opposite to that of said second pair of diodes; and
   g. a coaxial conductor connected to the adjacent ends of said elements, whereby when a first wave is impressed on said first waveguide and a second wave of different frequency is impressed on said second waveguide, the difference frequency wave is derived from said coaxial conductor.

2. A mixer as defined in claim 1 wherein means is provided for insulating each of said elements from its respective waveguide.

3. A mixer as defined in claim 2 wherein a capacitor is connected to the adjacent ends of each of said elements to provide coupling and direct current isolation.

4. A mixer as defined in claim 3 wherein means is provided for individually biasing said diodes.

5. A mixer as defined in claim 1 wherein means is provided for impressing a radio frequency wave on one of said waveguides and additional means for impressing a local oscillator wave on the other waveguide, said waves being out of phase, whereby the intermediate frequency wave is derived from said coaxial cable.

6. A mixer as defined in claim 5 wherein a waveguide adaptor is connected to said waveguides.

7. A broadband waveguide mixer suitable for use in the microwave and millimeter wave regions comprising:
   a. a mixer mount;
   b. a first waveguide extending through said mount;
   c. a second waveguide extending through said mount and disposed substantially parallel to and spaced from said first waveguide;
   d. a first elongated conductive element extending transversely through said mount and said first waveguide;
   e. a second elongated conductive element extending transversely through said mount and said second waveguide, said elements being disposed substantially on a common axis and having their adjacent ends spaced from each other;
   f. means for insulating said conductive elements from said mount;
   g. a first pair of diodes arranged back-to-back and disposed in said first waveguide and in contact with said first element;
   h. a second pair of diodes arranged back-to-back and disposed in said second waveguide and in contact with said second element, said first pair of diodes having a polarity opposite to that of said second pair of diodes; and
   i. a coaxial conductor connected to the adjacent ends of said elements, whereby when a first wave is impressed on said first waveguide and a second wave of different frequency is impressed on said second waveguide, the difference frequency wave is derived from said coaxial conductor.

8. A mixer as defined in claim 7 wherein a conductive member is provided for each of said diodes, each of said conductive members extending through said mixer mounts, and means for insulating each of said members from said mount.

9. A waveguide mixer as defined in claim 8 wherein a capacitor is connected between each of the adjacent ends of said elements and said coaxial conductor.

10. A mixer as defined in claim 9 wherein means is connected between each of said conductive elements and an associated one of said conductive members for individually biasing said diodes.

11. A mixer as defined in claim 7 wherein an opening is provided through said mixer mount through which said coaxial conductor extends.

* * * * *